(12) United States Patent
Pan

(10) Patent No.: US 7,932,556 B2
(45) Date of Patent: Apr. 26, 2011

(54) STRUCTURE AND METHOD FOR FORMING POWER DEVICES WITH HIGH ASPECT RATIO CONTACT OPENINGS

(75) Inventor: James Pan, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 85 days.

(21) Appl. No.: 12/333,597

(22) Filed: Dec. 12, 2008

(65) Prior Publication Data

US 2009/0189218 A1    Jul. 30, 2009

Related U.S. Application Data

(60) Provisional application No. 61/013,757, filed on Dec. 14, 2007.

(51) Int. Cl.
 *H01L 29/66* (2006.01)
(52) U.S. Cl. .............. 257/330; 257/E29.262; 438/270
(58) Field of Classification Search .............. 257/330, 257/E29.262; 438/270
 See application file for complete search history.

(56) References Cited

U.S. PATENT DOCUMENTS

| | | | |
|---|---|---|---|
| 6,686,614 B2 * | 2/2004 | Tihanyi | 257/155 |
| 6,787,450 B2 | 9/2004 | Sinha et al. | |
| 2006/0264043 A1 | 11/2006 | Stewart et al. | |
| 2006/0273386 A1 | 12/2006 | Yilmaz et al. | |
| 2007/0190728 A1 | 8/2007 | Sreekantham et al. | |
| 2007/0221952 A1 | 9/2007 | Thorup et al. | |

OTHER PUBLICATIONS

International Search Report of the International Searching Authority for Application No. PCT/US2008/086851, mailed Feb. 18, 2009, 2 pages.
Written Opinion of the International Searching Authority for Application No. PCT/US2008/086851, mailed Feb. 18, 2008, 5 pages.

* cited by examiner

*Primary Examiner* — Evan Pert
*Assistant Examiner* — Matthew Reames
(74) *Attorney, Agent, or Firm* — Kilpatrick Townsend & Stockton LLP

(57) ABSTRACT

A field effect transistor (FET) includes body regions of a first conductivity type over a semiconductor region of a second conductivity type. Source regions of the second conductivity type extend over the body regions. Gate electrodes extend adjacent to but are insulated from the body regions by a gate dielectric layer. Contact openings extend into the body regions between adjacent gate electrodes. A seed layer extends along the bottom of each contact opening. The seed layer serves as a nucleation site for promoting growth of conductive fill material. A conductive fill material fills a lower portion of each contact opening. An interconnect layer fills an upper portion of each contact opening and is in direct contact with the conductive fill material. The interconnect layer is also in direct contact with corresponding source regions along upper sidewalls of the contact openings.

20 Claims, 12 Drawing Sheets

US 7,932,556 B2

STRUCTURE AND METHOD FOR FORMING POWER DEVICES WITH HIGH ASPECT RATIO CONTACT OPENINGS

CROSS-REFERENCES TO RELATED APPLICATIONS

This application claims the benefit of U.S. Provisional Application No. 61/013,757, filed Dec. 14, 2007, which is incorporated herein by reference in its entirety for all purposes.

BACKGROUND OF THE INVENTION

The present invention relates in general to semiconductor technology and more particularly to semiconductor power devices with high aspect ratio contact openings and methods for forming the same.

Generally, an n-channel trench-gate power MOSFET includes an n-type substrate on which an n-type epitaxial layer is formed. The substrate embodies the drain of the MOSFET. A p-type body region extends into the epitaxial layer. Trenches extend through the body region and into the portion of the epitaxial layer bounded by the body region and the substrate (commonly referred to as the drift region). A gate dielectric layer is formed on the sidewalls and bottom of each trench. Source regions flank the trenches. Heavy body regions are formed within the body region between adjacent source regions. Gate electrodes (e.g., from polysilicon) fill the trenches and embody the gate of the MOSFET. A dielectric cap covers the trenches and also partially extends over the source regions. A top-side metal layer electrically contacts the source regions and the heavy body regions. A bottom-side metal layer contacts the substrate.

In some MOSFETs, the metal contact to the source and heavy body regions is made through contact openings. As the process technology migrates to smaller geometries, forming and properly filling such contact openings becomes more difficult. Thus, there is a need for techniques that enable forming and properly filling such contact openings in power devices.

BRIEF SUMMARY OF THE INVENTION

In accordance with an embodiment of the invention, a field effect transistor (FET) includes body regions of a first conductivity type over a semiconductor region of a second conductivity type. Source regions of the second conductivity type extend over the body regions. Gate electrodes extend adjacent to but are insulated from the body regions by a gate dielectric layer. Contact openings extend into the body regions between adjacent gate electrodes. A seed layer extends along the bottom of each contact opening. The seed layer serves as a nucleation site for promoting growth of conductive fill material. A conductive fill material fills a lower portion of each contact opening. An interconnect layer fills an upper portion of each contact opening and is in direct contact with the conductive fill material. The interconnect layer is also in direct contact with corresponding source regions along upper sidewalls of the contact openings.

In one embodiment, dielectric spacers line lower sidewalls of each contact opening, and serve to prevent the conductive fill material from directly contacting the body regions along lower sidewalls of the contact openings.

In another embodiment, a heavy body region of the first conductivity type extends in each body region along the bottom of each contact opening, and is in direct contact with the heavy body region.

In another embodiment, each gate electrode is disposed in a trench extending adjacent the body regions and terminating within the semiconductor region.

In another embodiment, each trench further includes a shield electrode disposed below the gate electrode, the gate and shield electrodes being insulated from one another by an inter-electrode dielectric layer.

In another embodiment, each trench includes a thick bottom dielectric extending along the bottom of the trench below the gate electrode.

In another embodiment, the gate electrodes extend laterally over the semiconductor and body regions and overlap the source regions.

In another embodiment, the top surfaces of the source regions are fully covered by dielectric material such that the interconnect layer makes direct contact with the source regions only along upper sidewalls of the contact openings.

In accordance with another embodiment of the invention, a method of forming a field effect transistor (FET) includes forming body regions of a first conductivity type in a semiconductor region of a second conductivity type such that the body regions forms p-n junctions with the semiconductor region. Gate electrodes are formed adjacent to but insulated from the body regions. Source regions of the second conductivity type are formed in the body regions such that the source regions form p-n junctions with the body regions. Contact openings extending into the body regions are formed. A seed layer extending along the bottom of each contact opening is formed. A lower portion of each contact opening is filled with a conductive fill material, wherein the seed layer serves as a nucleation site for promoting growth of the conductive fill material. An interconnect layer is formed filling an upper portion of each contact opening and being in direct contact with the conductive fill material. The interconnect layer is also in direct contact with corresponding source regions along upper sidewalls of the contact openings.

In one embodiment, prior to filling the lower portion of each contact openings, dielectric spacers are formed lining sidewalls of each contact opening.

In another embodiment, prior to forming the seed layer, a heavy body region of the first conductivity type is formed in each body region along the bottom of each contact opening.

In another embodiment, trenches extending into semiconductor regions are formed. The trenches house the gate electrodes.

In another embodiment, the step of filling a lower portion of each contact opening is carried out using electro-less plating.

In another embodiment, the seed layer comprises silicide.

It is to be noted that the appended drawings illustrate merely some exemplary embodiments and are therefore not to be considered limiting of its scope, for the invention may admit to other equally effective embodiments.

DETAILED DESCRIPTION OF THE INVENTION

In accordance with embodiments of the present invention, techniques directed to integrated circuits and their processing are described. More particularly, in some embodiments, power field effect transistors (FETs) include contact structures having silicided bottom and sidewalls partially lined with dielectric material. Merely by way of example, the techniques according to the invention have been applied to trench power MOSFETs, but the invention has a much broader range of applicability. For example, the techniques according to the invention can be applied to planar power MOSFETs or IGBTs, and in general to any semiconductor device that may benefit from such techniques.

Figure 1A:
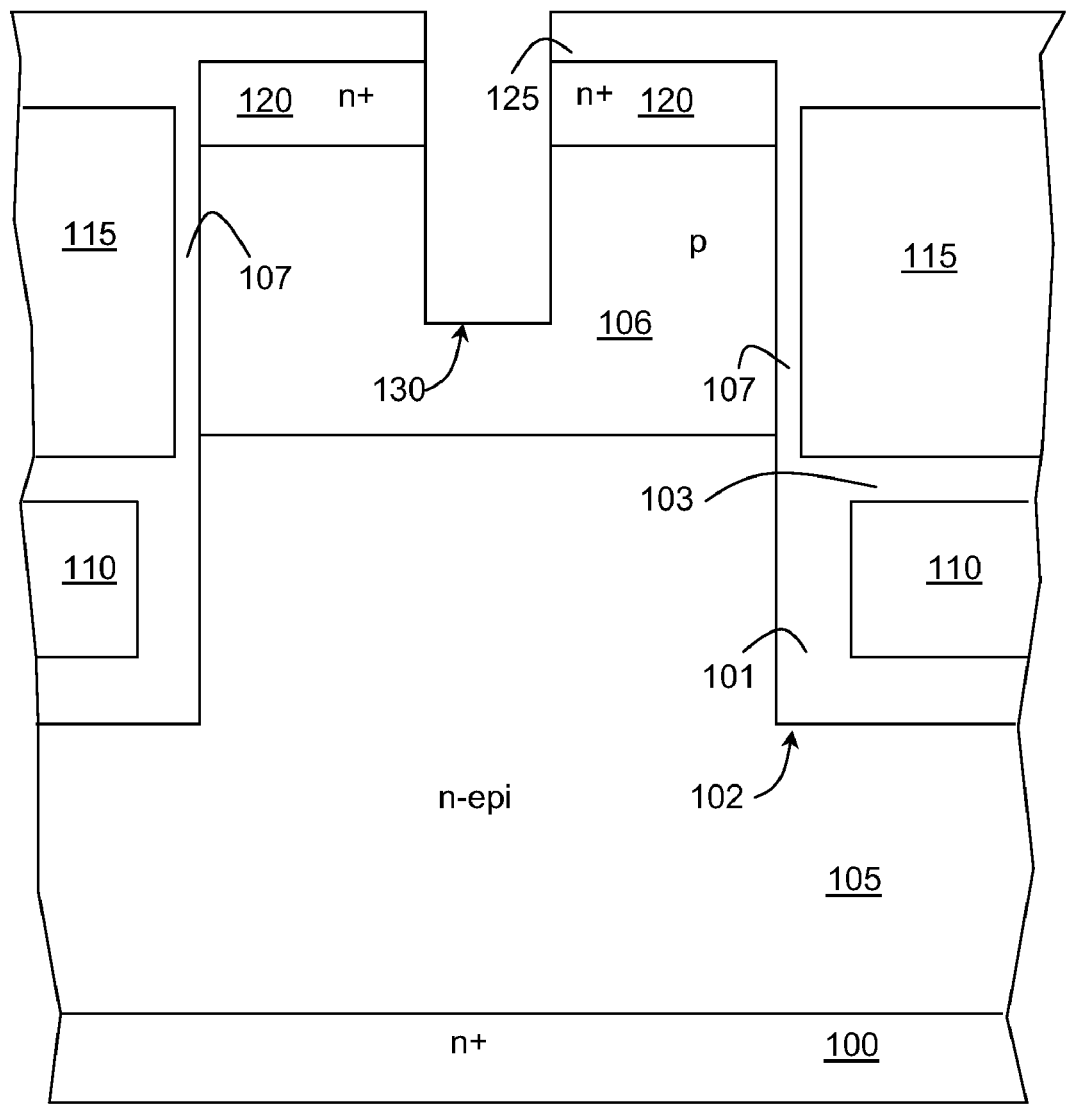
FIGS. 1A-1H are simplified cross-sectional views showing an exemplary method for forming a contact structure of an exemplary shielded gate trench metal-oxide-semiconductor field effect transistor according to an embodiment of the present invention.

FIGS. 1A-1H are simplified cross-sectional views showing an exemplary method for forming a contact structure of an exemplary trench metal-oxide-semiconductor field effect transistor, in accordance with an embodiment of the invention. In FIG. 1A, epitaxial layer 105 is formed over substrate 100 using known techniques. Substrate 100 can be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. The embodiment shown is an n-channel MOSFET, and substrate 100 and epitaxial layer 105 may include n-type dopants such as phosphorus, arsenic and/or other group V elements.

P-type body region 106 may be formed in or over epitaxial layer 105. In some embodiments, body region 106 may be formed by implanting dopants in epitaxial layer 105. In other embodiments, body region 106 may be formed by an epitaxial process over epitaxial layer 105. Trenches 102 extending through body region 106 and terminating within a region of epitaxial layer 105 bounded by body region 106 and substrate 100 is formed using conventional techniques. The region of epitaxial layer 105 bounded by body region 106 and substrate 100 is commonly referred to as the drift region. Shield dielectric layer 101 lining the bottom and the lower sidewalls of trenches 102 is formed using known processes.

Shield electrode 110 (e.g., comprising doped or undoped polysilicon) is formed in a bottom portion of each trenches 102 using conventional techniques. Inter-electrode dielectric 103 (e.g., comprising oxide) extending over shield electrode 110 is formed in each trench using conventional techniques. Gate dielectric layer 107 lining upper trench sidewalls is formed using know techniques. In some embodiments, gate dielectric layer 107 is thinner than shield dielectric layer 101. Gate electrode 115 is formed in an upper portion of each trench 102 using conventional methods. N-type source regions are formed in body regions 106 adjacent the trenches, using known techniques.

Gate dielectric 107 may comprise, for example, oxide, nitride, oxynitride, dielectric material, high-k dielectric material or various combinations thereof. In some embodiments, the high-k dielectric can be one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. Gate dielectric 107 may be formed by, for example, a chemical vapor deposition (CVD) process, a physical vapor deposition (PVD) process or other known processes. Gate electrodes 115 may comprise, for example, polysilicon; amorphous silicon; metal-containing material such as Ru, Ti, Ta, W, Hf, metal nitride stacked gates; metal oxide gates such as $RuO_2$ or $IrO_2$; metal nitride gates such as MoN, WN, TiN, TaN, TaAlN; poly SiGe; gate silicide such as $CoSi_2$ or NiSi; or various combinations thereof. Gate electrodes 115 may be formed by, for example, a CVD process, a PVD process, an electrochemical plating process, an electroless plating process or other known techniques.

In FIG. 1A, a dielectric layer 125 is formed over source regions 120. In some embodiments, dielectric layer 125 overlies gate electrodes 115 as well. Dielectric layer 125 may comprise, for example, oxide, nitride, oxynitride, other dielectric material or various combinations thereof. In some embodiments, dielectric layer 125 may be a boron-phosphorus-silicate-glass (BPSG) layer which can be formed by, for example, a CVD process. While dielectric layer 125 is shown as having a flat top surface, in some embodiments, it may have a dome shape with the thickest portion over gate electrodes 115 and reducing in thickness as it reaches the edges of contact openings 130.

Contact openings 130 are formed in a center portion of body region 106 between adjacent trenches. In some embodiments, contact openings 130 are formed using a patterned mask layer having a pattern corresponding to openings 130. The patterned mask may be, for example, a patterned photoresist layer or a patterned dielectric layer.

Figure 1B:
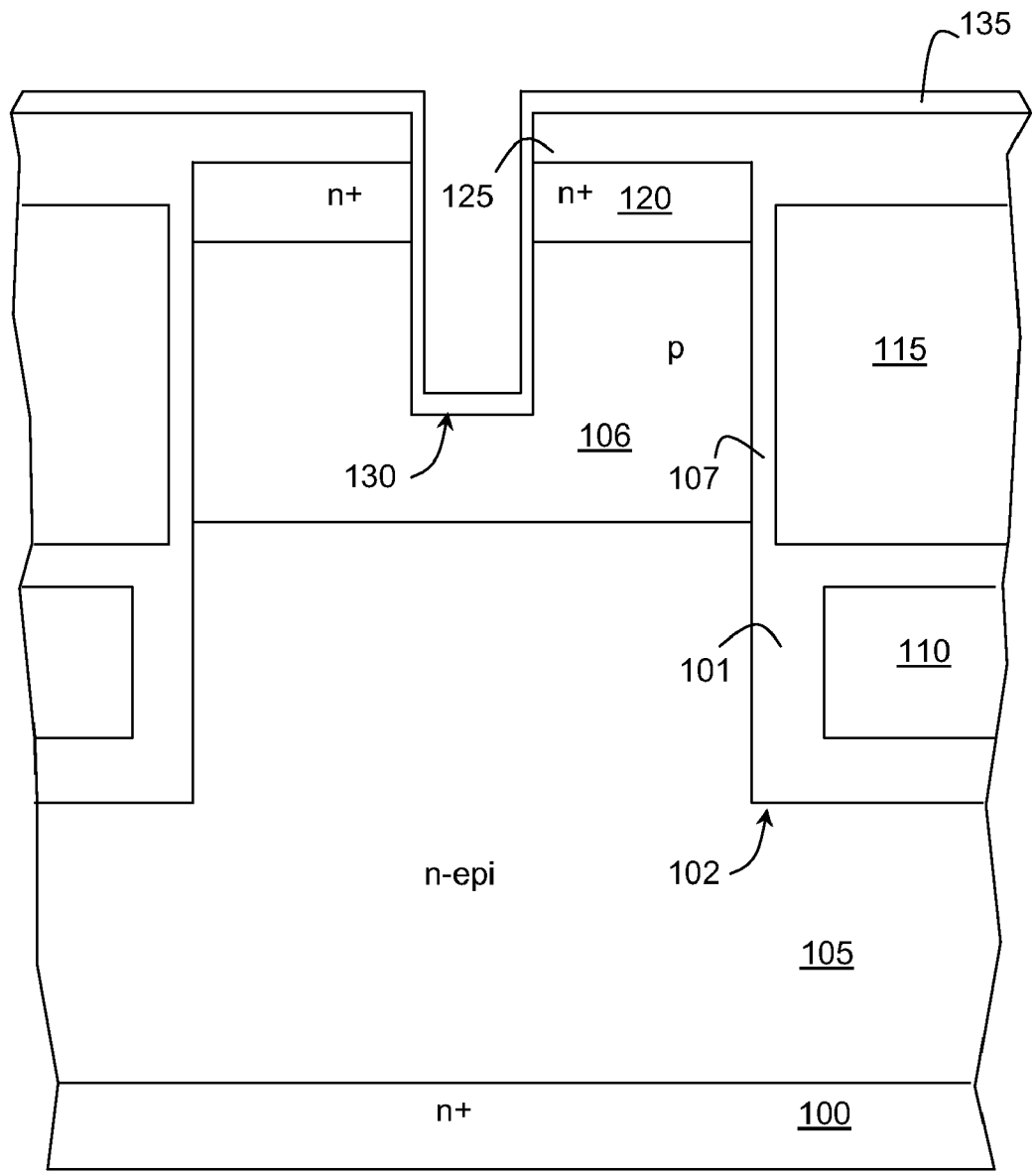

In FIG. 1B, a relatively thin dielectric layer 135 is formed over the structure shown in FIG. 1A. In some embodiments, the dielectric layer 135 may be substantially conformal so as to line sidewalls and bottom of contact openings 130. Dielectric layer 135 may comprise, for example, oxide, nitride, oxynitride, or various combinations thereof. Dielectric layer 135 may be formed by, for example, a CVD process or a thermal oxidation process. In some embodiments, dielectric layer 135 may have a thickness between about 50 Å and about 500 Å. Because dielectric layer 135 at least partially remains in contact openings 130 in the later steps when contact openings 130 are filled, the thickness of dielectric layer 135 needs to be carefully selected so that the already high aspect ratio of contact openings 130 is not made significantly increased.

Figure 1C:
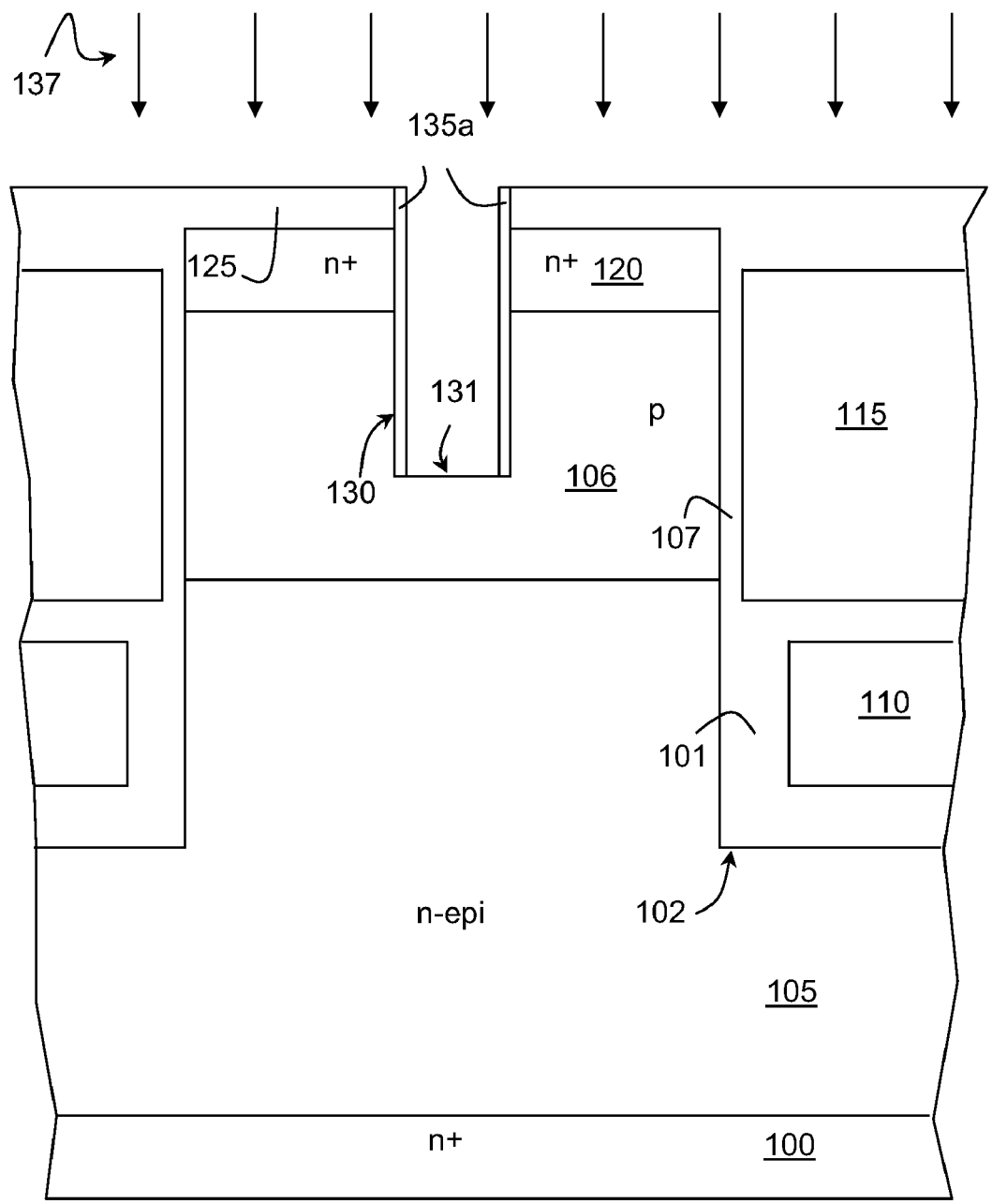

In FIG. 1C, etch process 137 is used to remove a portion of dielectric layer 135 to thereby form dielectric spacers 135a along sidewalls of trenches 130. In one embodiment, an etch process is used that removes horizontally extending portions of dielectric layer 135 while leaving the vertically extending portions intact. In this manner, body region 106 becomes exposed along bottom 131 of contact openings 130 while sidewalls of contact openings 130 remain covered by dielectric layer 135. Etch process 137 may be a dry etch process and/or a wet etch process.

Figure 1D:
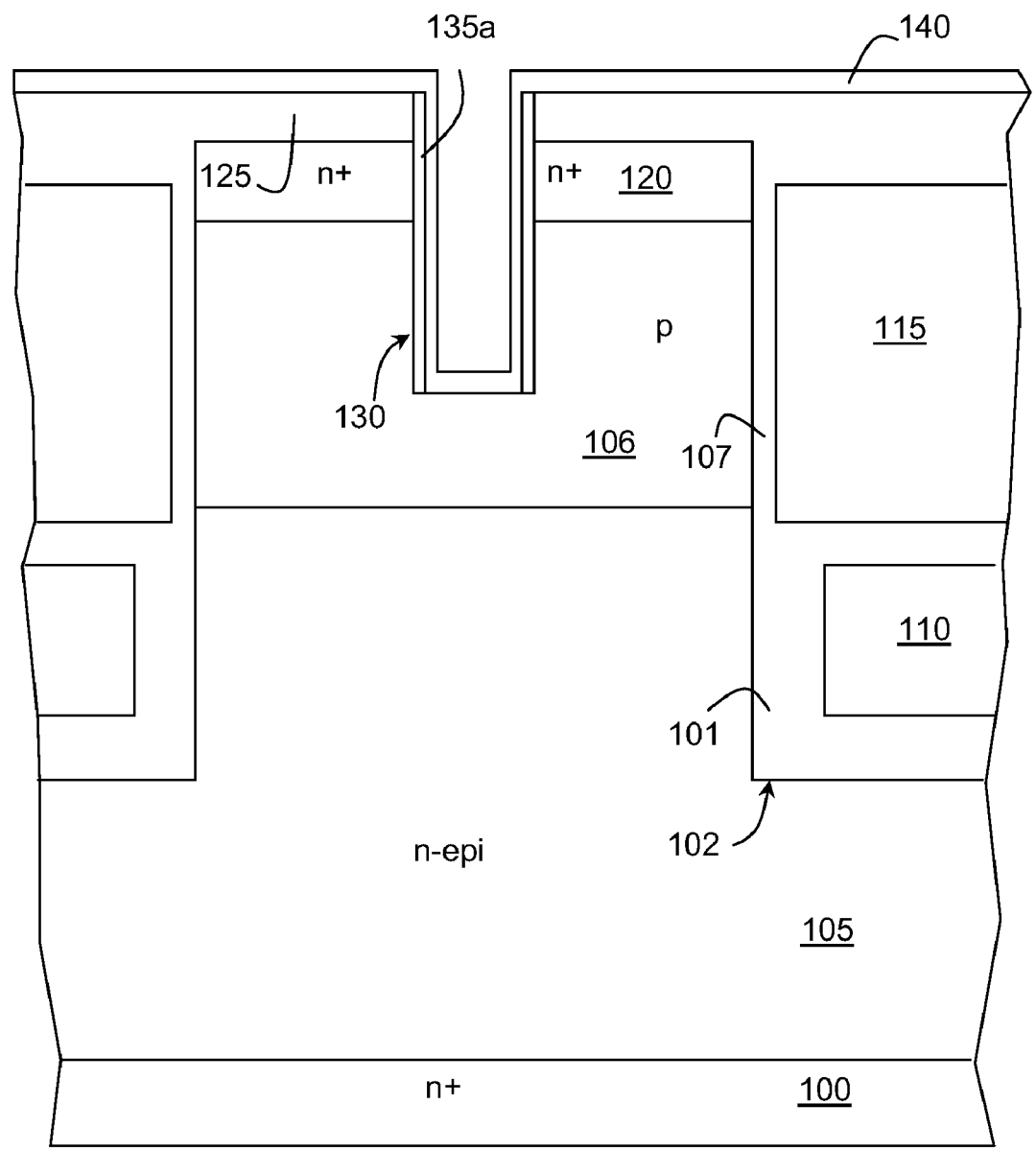
Figure 1E:
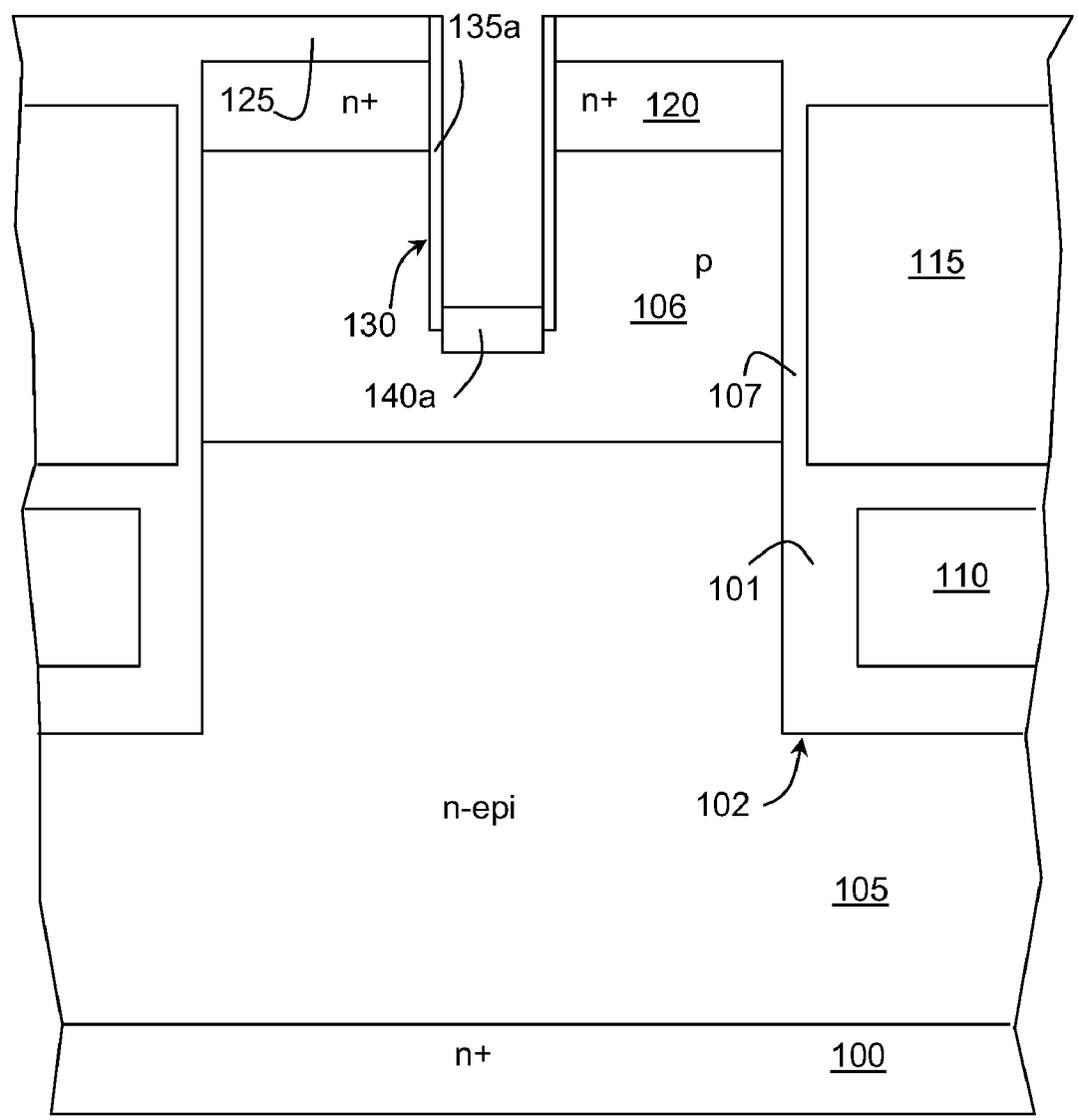

FIGS. 1D and 1E show the process for forming a seed layer 140a along the bottom of contact openings 130. As will be seen, seed layer 140a serves as a nucleation site for growing highly conductive fill material in a lower portion of each contact opening. In FIG. 1D, a metal-containing layer 140 is formed over the structure. In some embodiments, metal-containing layer 140 may be substantially conformal so as to line spacers 135a and directly contact body region 106 along bottom 131 of contact openings 131. Metal-containing layer 140 may include tungsten, cobalt, titanium, nickel, tantalum, platinum, other metallic material that is adapted to form a desired resistivity phase with silicon, or various combinations thereof. Metal-containing layer 140 may be formed by, for example, a PVD process or a CVD process. In some embodiments, metal-containing layer 140 may have a thickness between about 50 Å and about 300 Å.

In FIG. 1E, a silicide process whereby metal-containing layer 140 is reacted with body region 106 is carried out to thereby form a silicide layer 140a along the bottom of contact openings 130. The silicide process may include a thermal process for interacting metal-containing layer 140 with body region 106. The thermal process may include, for example, a rapid thermal anneal (RTA) process, a furnace thermal process, other thermal process that may desirably form silicide layer 140a, or various combinations thereof. Silicide layer 140a may be a tungsten silicide layer, a cobalt silicide layer, a titanium silicide layer, a tantalum silicide layer, a nickel silicide layer, a platinum silicide layer, other silicide layer or various combinations thereof.

After the silicide process, the un-reacted portions of metal-containing layer 140 are removed, with the silicide layer 140a left along the trench bottoms. That is, all portions of metal-containing layer 140 extending over dielectric layer 125 and dielectric spacers 135a are removed. A wet etch process and/or a dry etch process may be used for this purpose.

Figure 1F:
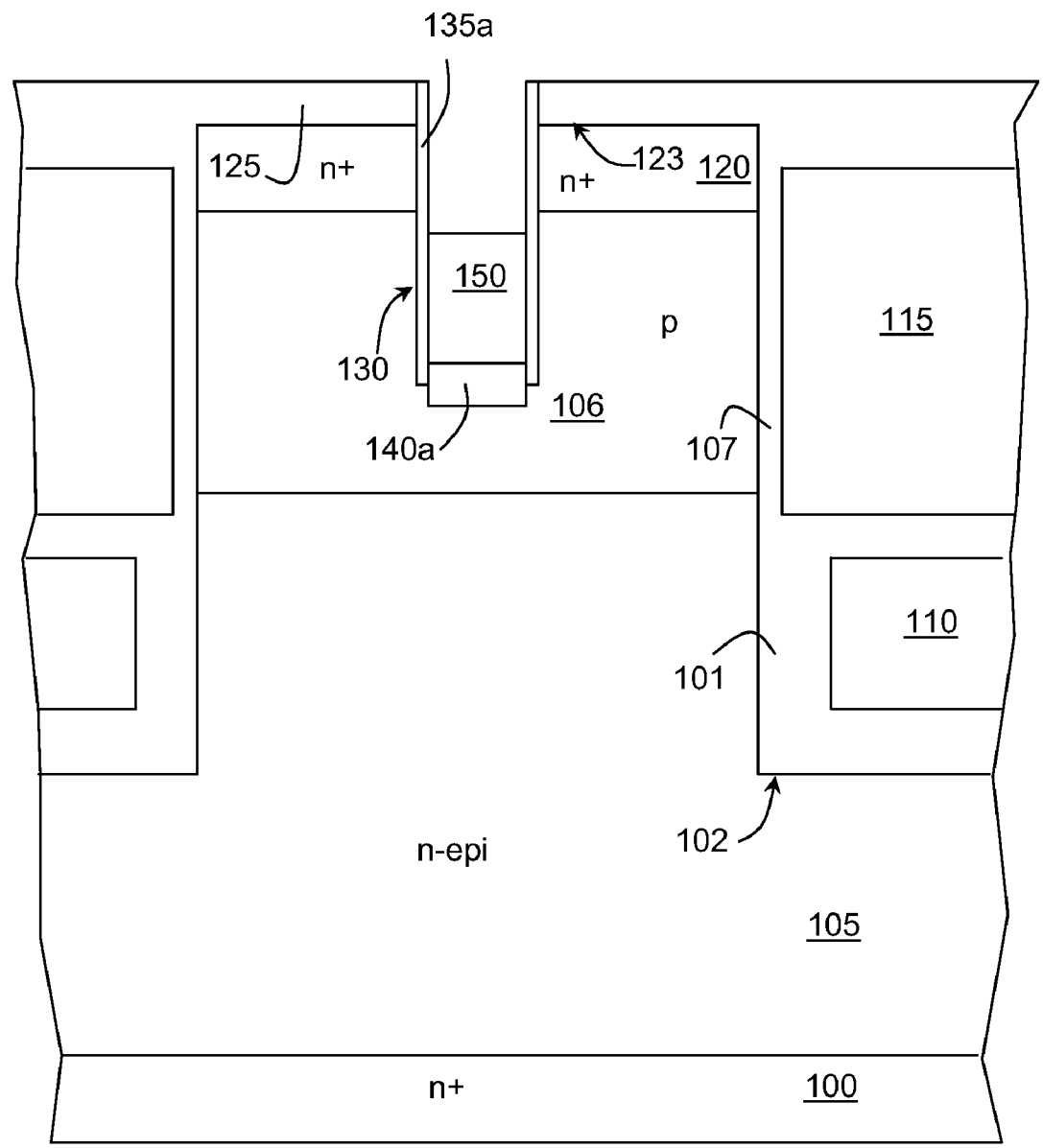

In FIG. 1F, a highly conductive fill material 150 is formed to partially fill contact openings 130 using a selective fill process. Fill material 150 may comprise, for example, copper, tungsten, aluminum, silicon, titanium, tantalum, silicide material, other metallic material or various combinations thereof. In some embodiments, fill material 150 may be formed by an electroless plating process using silicide layer 140a as a seed layer over which fill material 150 is formed. That is, silicide layer 140a serves as a nucleation site for promoting growth of metal fill 150. Because of the selective nature of the fill process, fill material 150 is not formed from dielectric spacers 135a toward the center of contact openings 130d. Rather, metal fill material 150 is gradually formed from the top surface of silicide layer 140a upwardly. In the absence of dielectric spacers 135a, fill material 150 would form laterally from the trench sidewalls toward the center of trench leading to keyhole or voids in the fill material. Accordingly, dielectric spacers 135a advantageously prevent formation of keyholes in fill material 150. Note that doped silicon can also be used as seed layer 140a. Electroless metal can be deposited selectively on doped silicon.

Fill material 150 is formed such that its top surface is below top surface 123 of source regions 120. As will be seen, this is necessary in order to allow contact to be made to source regions 120 along upper sidewalls of contact openings 130. In the particular embodiment shown, fill material 150 is formed such that its top surface is below the bottom surface of source regions 10. This ensures that the entire sidewall of each source region 120 is available for forming a low resistance contact with source regions 120.

Figure 1G:
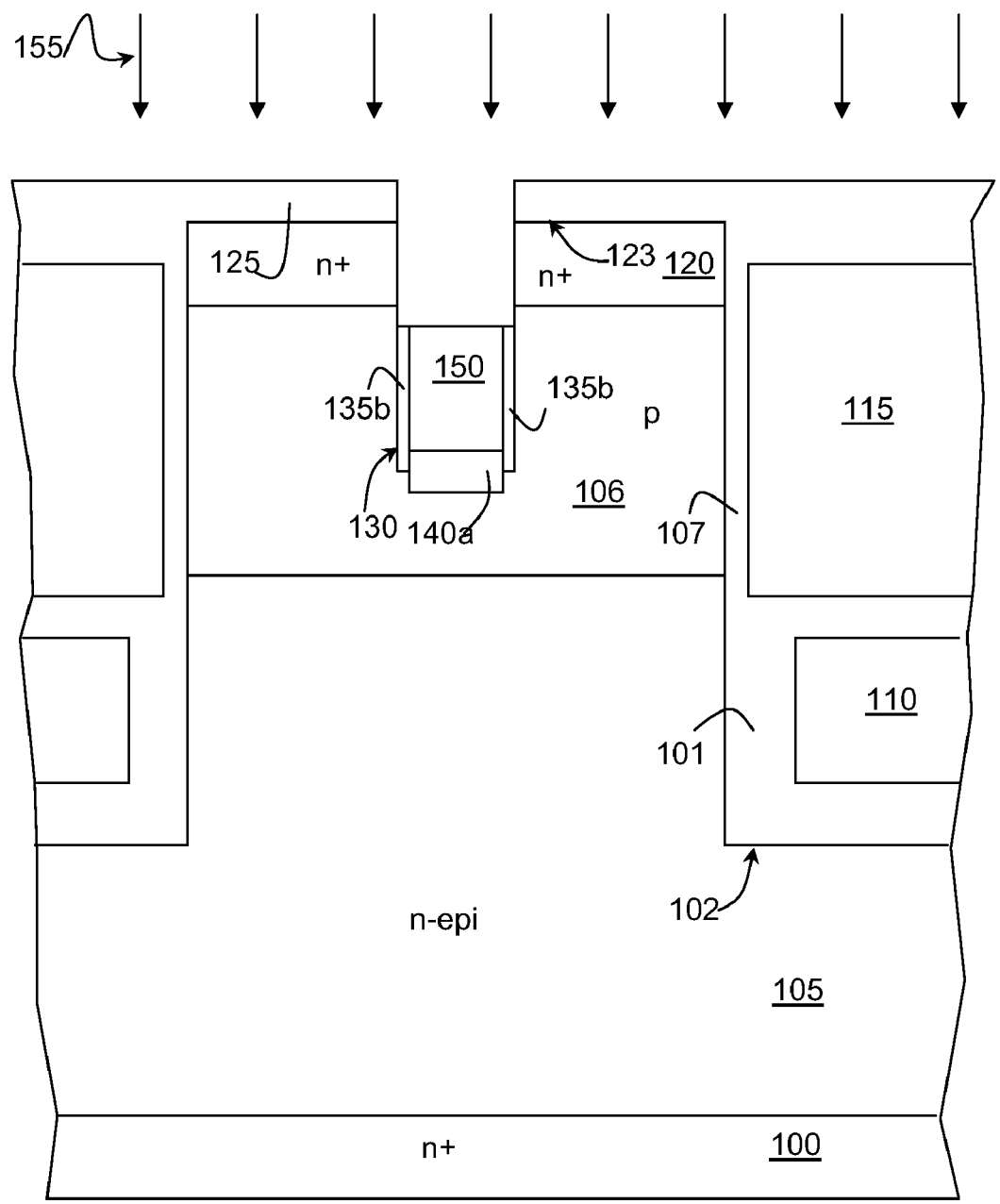

In FIG. 1G, etch process 155 may be used to remove exposed portions of dielectric spacers 135a so that dielectric spacer portions 135b covered by fill material 150 remain. Removed portions of dielectric spacers 135a expose upper sidewalls of contact openings 120 where contact can be made to source regions 120. Etch process 155 may be a wet etch process and/or a dry etch process. In some embodiments, etch process 155 may also remove a portion of dielectric layer 125.

Figure 1H:
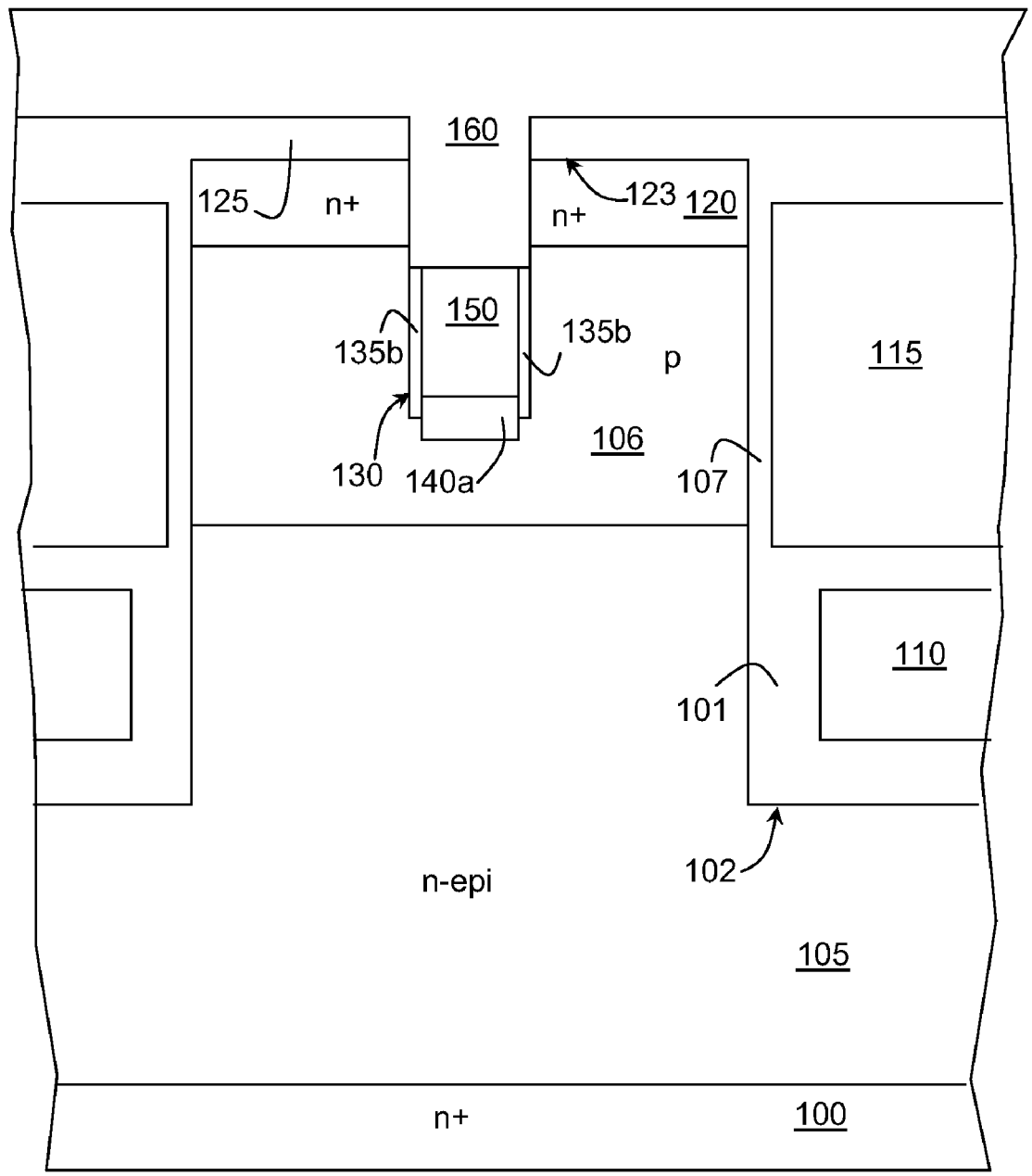

In FIG. 1H, a top-side source interconnect layer 160 is formed over the structure, substantially filling the contact openings 130. Source interconnect layer 160 makes direct contact with top surface of fill material 150 and with source regions 120 along upper trench sidewalls, and indirect contact with body region 106 through the highly conductive fill material 150 and silicide layer 140a. An interface 163 may appear between source interconnect layer 160 and highly conductive fill material 150 because they may be formed by different processes and/or formed of different materials. Source interconnect layer 160 may comprise, for example, copper, tungsten, aluminum, aluminum copper, titanium, tantalum, cobalt, nickel, platinum, polysilicon, or various combinations thereof. Source interconnect layer 160 may be formed by a CVD process, a PVD process, an electrochemical planting process and/or an electroless plating process.

The two step fill process (i.e., an initial fill with conductive fill material 150, followed by second fill with interconnect layer 160) advantageously allows filling high aspect ratio contact openings without formation of keyholes or voids. By filling a portion of contact openings 130 with fill material 150, the aspect ratio of the opening is in effect reduces thus ensuring that no voids are formed when interconnect layer 160 fills upper portion of contact openings 130. Also, the technique of forming dielectric spacers 135b along lower sidewalls of contact openings 130 ensures that no voids are formed in fill material 150 either, since dielectric spacers limit growth of fill material 150 to the bottom-up direction (i.e., no lateral growth takes place).

After forming the top-side source interconnect layer 160, a backside drain interconnect layer (not shown) may be formed on the backside of substrate 100. The drain interconnect layer may comprise, for example, copper, tungsten, aluminum, aluminum copper, titanium, tantalum, cobalt, nickel, platinum, polysilicon, or various combinations thereof.

Figure 2:
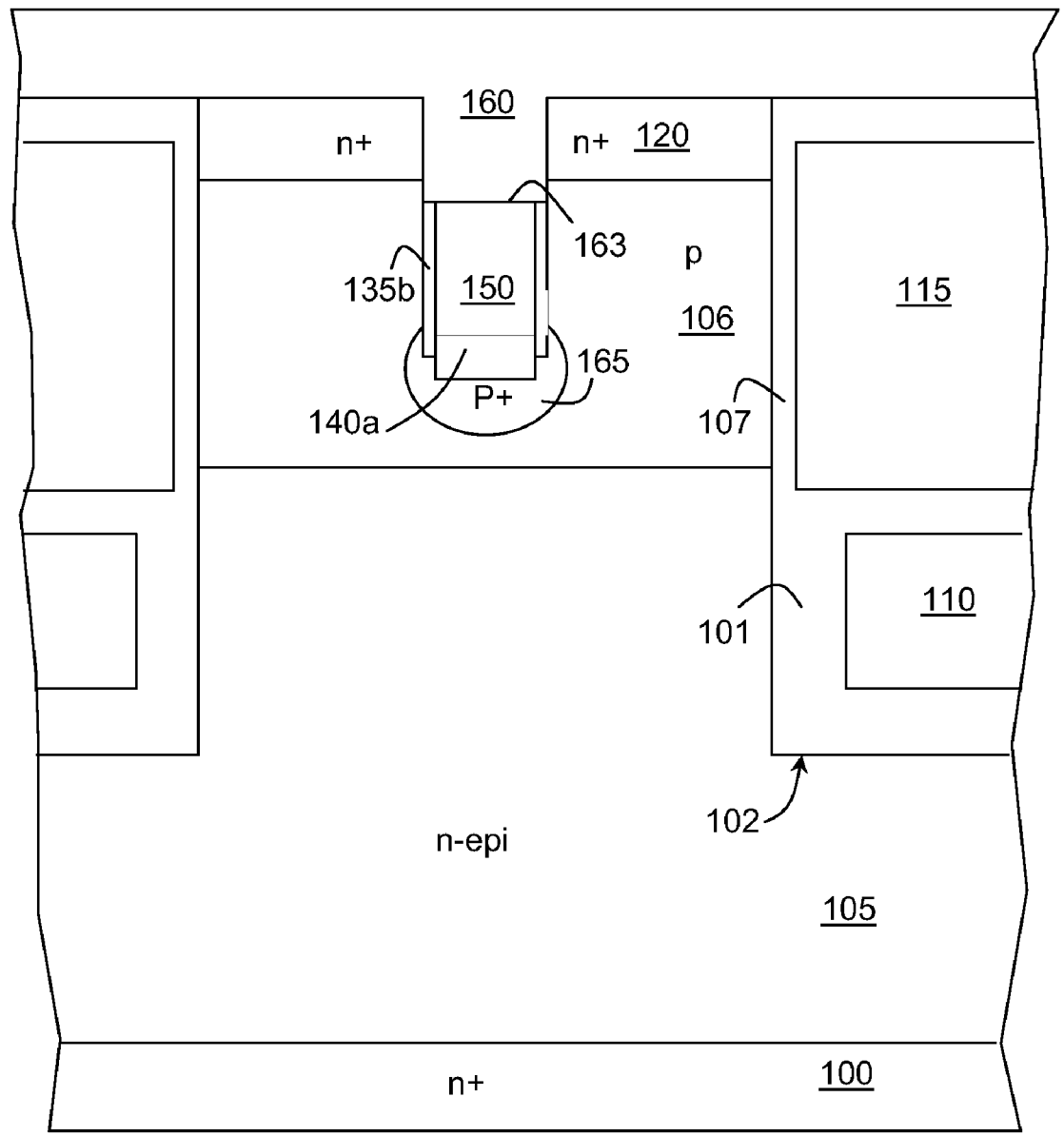
FIG. 2 is a simplified cross-sectional view of an exemplary shielded gate trench MOSFET according to another embodiment of the present invention.

FIG. 2 shows a variation of the structure in FIG. 1H where a p+ heavy body region 165 is formed in body region 106 along the bottom of each contact opening 165. Heavy body regions 165 may be formed by, for example, implanting dopants in body region 106 before forming silicon layer 140a along the bottom of the contact openings. FIG. 2 also illustrates another variation from the structure in FIG. 1H. Dielectric layer 125 is removed from over source regions 120 so that source interconnect layer 160 makes contact with source regions 120 along their top surfaces also. This is made possible by the fact that gate electrode 115 is recessed in trenches 102 and covered by dielectric material that insulates gate electrode 115 from source interconnect layer 160.

Figure 3:
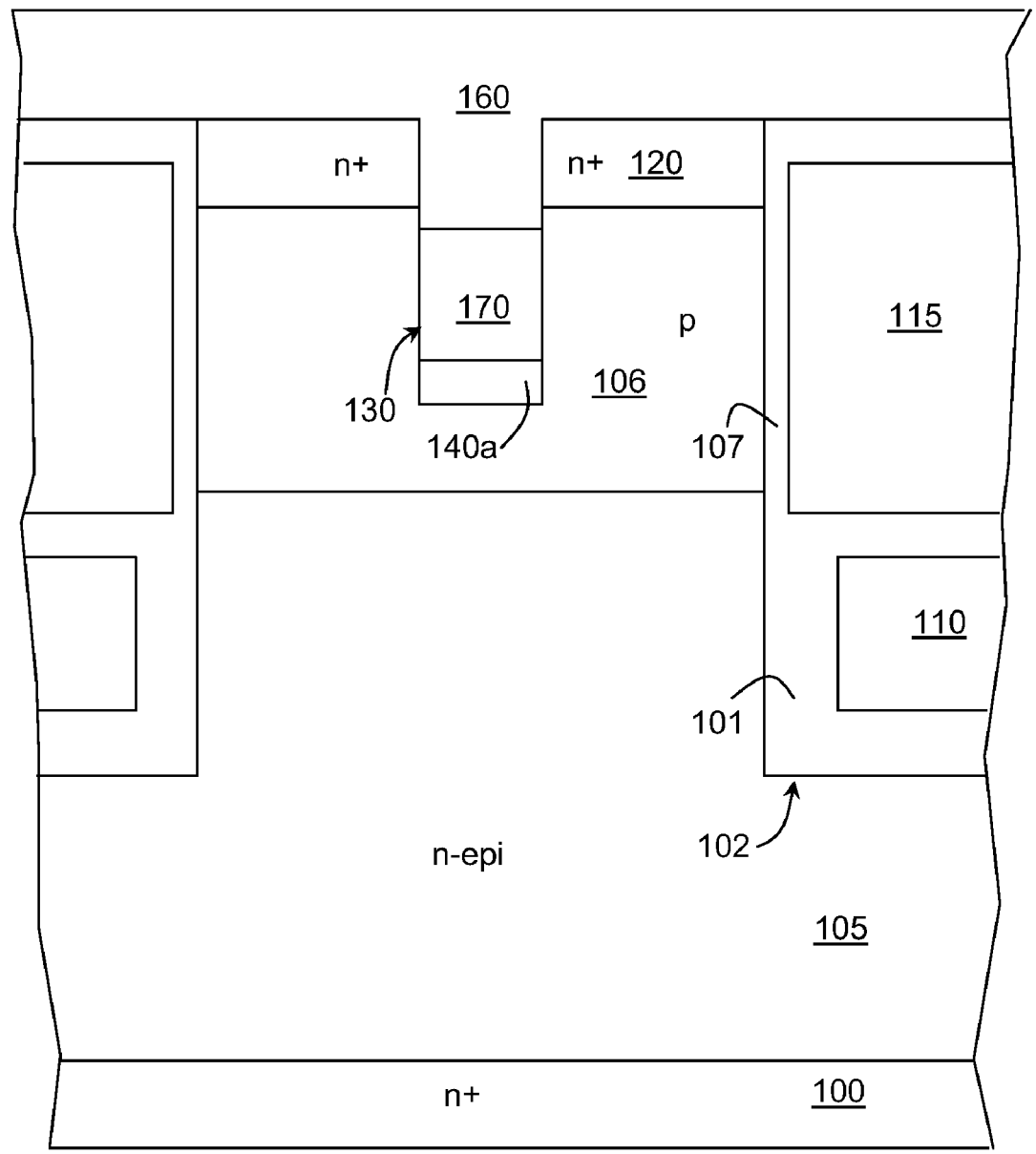
FIG. 3 is a simplified cross-sectional view of another exemplary shielded gate trench MOSFET according to yet another embodiment of the present invention.

FIG. 3 shows yet another variation of the structure in FIG. 1H. A highly conductive fill material 170 is formed between silicide layer 140a and source interconnect layer 160 without using dielectric spacers along sidewalls of the contact openings. This embodiment allows growth of fill material both in vertical and lateral directions. While this technique may lead to formation of a void in fill material 170, such void would be far less pronounced than in conventional single step fill processes. In some embodiments, silicide layer 140a may be formed so as to extend along sidewalls of contact openings 130.

Figure 4:
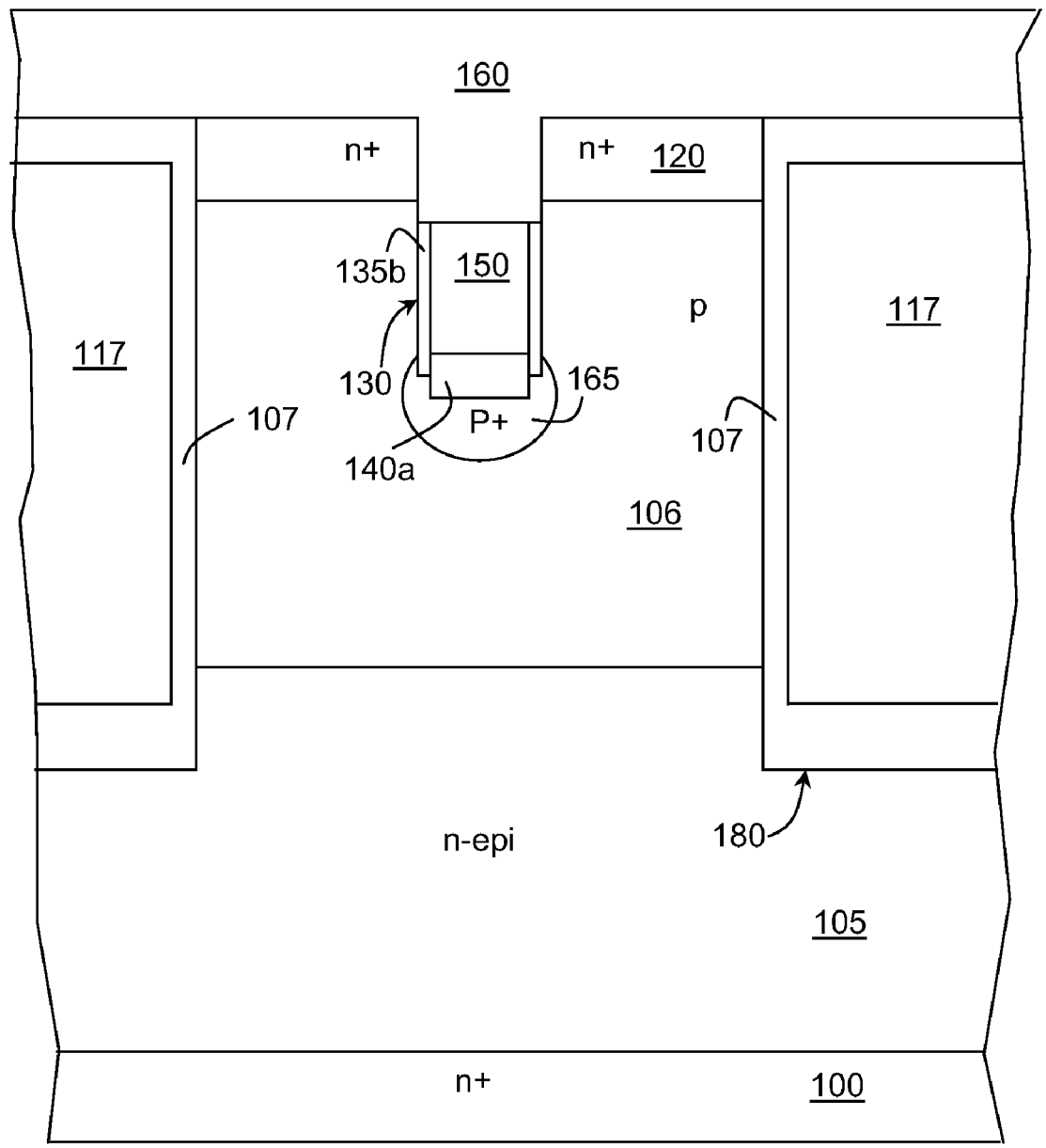
FIG. 4 is a simplified cross-sectional view of an exemplary trench gate MOSFET according to an embodiment of the present invention.

FIG. 4 is a simplified cross-sectional view of an exemplary trench gate MOSFET according to another embodiment of the present invention. This embodiment is substantially similar to the embodiment in FIG. 2 except that no shield electrode is formed under gate electrode 117. Instead a dielectric layer which in some embodiments is thicker than gate dielectric 107 (i.e., what is commonly knows as thick bottom dielectric TBO) extends under gate electrode 117 along the trench bottoms.

Figure 5:
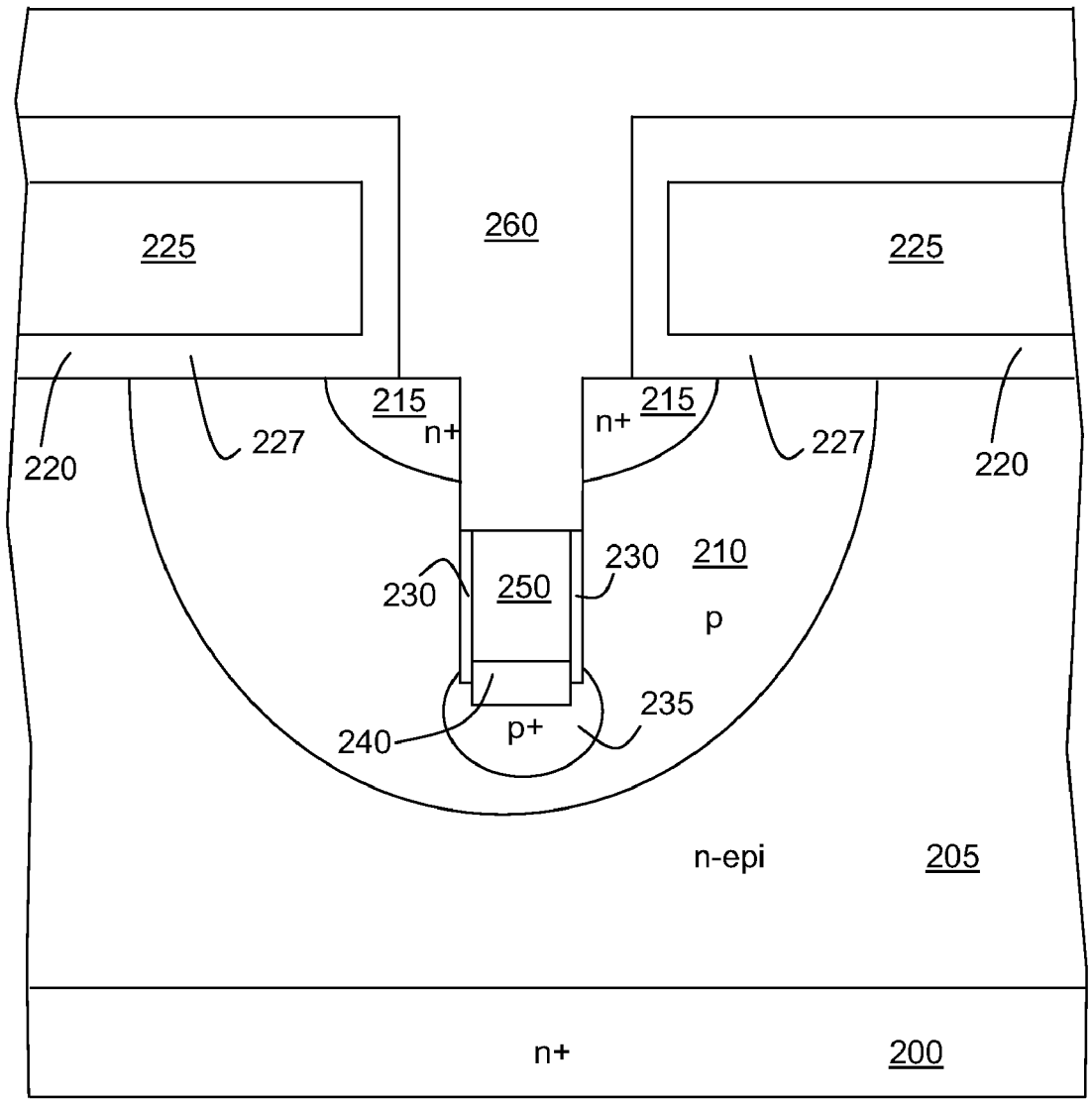
FIG. 5 is a simplified cross-sectional view of an exemplary planar MOSFET.

FIG. 5 is a simplified cross-sectional view of an exemplary planar MOSFET in accordance with yet another embodiment of the invention. The structure in FIG. 5 is the planar gate variation of the trench gate MOSFET shown in FIG. 4, and thus many of the same process and structural variations described above in connection with the body contact structure of the various embodiments also apply to the structure in FIG. 5.

In FIG. 5, n-type epitaxial layer 205 extends over n-type substrate 200. The stacks of gate dielectric layer 220 and gate electrode 225 are formed over epitaxial layer 205 using known techniques. Body regions 210 are formed in epitaxial layer 205 using conventional techniques.

The body contact structure in FIG. 5 has a similar structure to some of the above-described embodiments and thus the technique for forming the contact structure and its possible variations referenced above will not be described. The techniques for forming and filling the body contact opening according to embodiments of the invention may be even more helpful in the FIG. 5 structure because the gate structure extends over (rather than inside) epitaxial layer 205, and thus the contact opening that needs to be filled may have even a higher aspect ratio.

Note that while a portion of the lateral surface of each source region 215 is in direct contact with source interconnect layer 260, interconnect layer 260 making contact with source regions 215 along sidewalls of the contact opening is sufficient. That is the dielectric layer extending over and along the sides of gate electrodes 225 may be extended out to cover the entire lateral surface of source regions 215 and terminate at the upper corners of contact openings 230. While the resulting contact opening has even a greater aspect ratio, the techniques of the present invention can properly fill the contact openings. Such structure enables use of process techniques that advantageously result in formation of contact openings (e.g., using dielectric spacer along gate electrode sidewalls) that are self aligned to the gate electrodes.

The techniques in accordance with the invention describe herein are not limited to any particular types of transistors and may be implemented in a variety of devices where formation of high aspect ratio contact opening with void-free conductive material is desired. For example, the process sequence depicted in FIGS. 1A-1H can be used to form: p-channel shielded gate trench gate MOSFETs (i.e., a transistor similar in structure to that in FIG. 1H except that the conductivity type of all silicon regions is reversed); n-channel shielded gate trench IGBT (i.e., a transistor similar in structure to that in FIG. 1H except that a p-type substrate is used instead of the n-type substrate); p-channel shielded gate IGBT (i.e., a transistor similar in structure to that in FIG. 1H but with silicon regions of opposite conductivity except the substrate is kept n-type); p-channel variation of the trench gate MOSFET in FIG. 4; p-channel and n-channel IGBT variations of the trench gate MOSFET in FIG. 4; trench gate synchronous FET (i.e., integrated trench gate or shielded gate MOSFET and Schottky rectifier); trench gate and planar gate variety of laterally conducting MOSFETs (i.e., a transistor where the drain contact is made no the top-side) and suprejunction variations of all the above devices (i.e., devices with columns of alternating conductivity type silicon).

Thus, while the above is a complete description of specific embodiments of the present invention, various modifications, variations, and alternatives may be employed. The scope of this invention should thus not be limited to the embodiments described herein, but is instead defined by the following claims.

What is claimed is:
1. A field effect transistor (FET), comprising:
   body regions of a first conductivity type over a semiconductor region of a second conductivity type, the body regions forming p-n junctions with the semiconductor region;
   source regions of the second conductivity type over the body regions, the source regions forming p-n junctions with the body regions;
   gate electrodes extending adjacent to but being insulated from the body regions by a gate dielectric;
   contact openings extending into the body regions between adjacent gate electrodes;
   a seed layer extending along a bottom of each contact opening, the seed layer serving as a nucleation site for promoting growth of conductive fill material;
   a conductive fill material filling a lower portion of each contact opening, wherein an upper surface of the conductive fill material is below a bottom surface of the source regions; and
   an interconnect layer filling an upper portion of each contact opening and being in direct contact with the conductive fill material, the interconnect layer also being in direct contact with corresponding source regions along upper sidewalls of the contact openings.

2. The FET of claim 1 further comprising dielectric spacers lining lower sidewalls of each contact opening, the dielectric spacers preventing the conductive fill material from directly contacting the body regions along lower sidewalls of the contact openings.

3. The FET of claim 1 further comprising a heavy body region of the first conductivity type extending in each body region along the bottom of each contact opening, the seed layer being in direct contact with the heavy body region.

4. The FET of claim 1, wherein each gate electrode is disposed in a trench extending adjacent the body regions and terminating within the semiconductor region.

5. The FET of claim 4, wherein each trench further includes a shield electrode disposed below the gate electrode, the gate and shield electrodes being insulated from one another by an inter-electrode dielectric layer.

6. The FET of claim 4, wherein each trench includes a thick bottom dielectric extending along the bottom of the trench below the gate electrode.

7. The FET of claim 1, wherein the gate electrodes extend laterally over the semiconductor and body regions and overlap the source regions.

8. The FET of claim 1, wherein top surfaces of the source regions are fully covered by dielectric material such that the interconnect layer makes direct contact with the source regions only along upper sidewalls of the contact openings.

9. A method of forming a field effect transistor (FET), comprising:
   forming body regions of a first conductivity type in a semiconductor region of a second conductivity type, the body regions forming p-n junctions with the semiconductor region;
   forming gate electrodes adjacent to but insulated from the body regions;
   forming source regions of the second conductivity type in the body regions, the source regions forming p-n junctions with the body regions;
   forming contact openings extending into the body regions;
   forming a seed layer extending along a bottom of each contact opening;
   filling a lower portion of each contact opening with a conductive fill material, wherein the seed layer serves as a nucleation site for promoting growth of the conductive fill material and an upper surface of the conductive fill material is below a bottom surface of the source regions; and forming an interconnect layer filling an upper portion of each contact opening and being in direct contact with the conductive fill material, the interconnect layer also being in direct contact with corresponding source regions along upper sidewalls of the contact openings.

10. The method of claim 9 further comprising:
prior to filling the lower portion of each contact openings, forming dielectric spacers lining sidewalls of each contact opening.

11. The method of claim 9 further comprising:
prior to forming the seed layer, forming a heavy body region of the first conductivity type in each body region along the bottom of each contact opening.

12. The method of claim 9 further comprising:
forming trenches extending into semiconductor regions, the trenches housing the gate electrodes.

13. The method of claim 12 further comprising:
before forming the gate electrodes:
   forming a shield dielectric layer lining lower sidewalls and bottom of each trench;
   forming a shield electrode in a lower portion of each trench; and
   forming an inter-electrode dielectric layer in each trench over the shield electrode.

14. The method of claim 12 further comprising:
before forming the gate electrode, forming a thick bottom dielectric extending along the bottom of the trench.

15. The method of claim 9, wherein the gate electrodes extend laterally over the semiconductor and body regions and overlap the source regions.

16. The method of claim 9 further comprising:
forming a dielectric cap layer over the gate electrodes and the source regions, the dielectric cap layer fully covering top surfaces of the source regions such that the interconnect layer makes direct contact with the source regions only along upper trench sidewalls of the contact openings.

17. The method of claim 9, wherein the step of filling a lower portion of each contact opening is carried out using electro-less plating.

18. The method of claim 9, wherein the seed layer comprises silicide.

19. The method of claim 9, wherein the step of forming a seed layer comprises:
   forming dielectric spacers along sidewalls of each contact opening;
   forming a metallic layer lining the dielectric spacers and extending along the bottom of each contact opening, the metallic layer being in direct contact with the body region along the bottom of each contact opening;
   reacting the metallic layer with the body region to thereby form a silicide layer along the bottom of the trench; and
   removing the un-reacted portions of the metallic layer.

20. The method of claim 19 further comprising:
after the step of filling a lower portion of each contact opening, removing exposed portions of the dielectric spacers to thereby expose vertical surfaces of the source regions along upper sidewalls of each contact opening.

* * * * *